(12) United States Patent
Zhang et al.

(10) Patent No.: US 11,201,487 B2
(45) Date of Patent: Dec. 14, 2021

(54) WIRELESS CONTROL SWITCH AND WIRELESS CONTROL METHOD

(71) Applicant: BEIJING XIAOMI MOBILE SOFTWARE CO., LTD., Beijing (CN)

(72) Inventors: He Zhang, Beijing (CN); Yanlu Zhang, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 179 days.

(21) Appl. No.: 16/586,193

(22) Filed: Sep. 27, 2019

(65) Prior Publication Data

US 2020/0264235 A1 Aug. 20, 2020

(30) Foreign Application Priority Data

Feb. 15, 2019 (CN) .......................... 201910122674.1

(51) Int. Cl.
| | |
|---|---|
| *H05B 47/19* | (2020.01) |
| *H01H 47/00* | (2006.01) |
| *H01H 47/02* | (2006.01) |
| *H02J 7/00* | (2006.01) |
| *G01R 31/327* | (2006.01) |
| *H01H 9/02* | (2006.01) |
| *H05B 39/08* | (2006.01) |

(52) U.S. Cl.
CPC ........ *H02J 7/0068* (2013.01); *G01R 31/3278* (2013.01); *H01H 9/0235* (2013.01); *H05B 39/088* (2013.01); *H05B 47/19* (2020.01)

(58) Field of Classification Search
CPC . H02J 7/0068; G01R 31/3278; H01H 9/0235; H05B 39/088; H05B 47/19
See application file for complete search history.

(56) References Cited

U.S. PATENT DOCUMENTS

2018/0204696 A1* 7/2018 Liu ........................ H01H 47/02

FOREIGN PATENT DOCUMENTS

| EP | 1524750 A2 | 4/2005 |
|---|---|---|
| EP | 3349547 A1 | 7/2018 |

OTHER PUBLICATIONS

European Search Report in the European Application No. 19200593.2, dated Nov. 28, 2019, (11p).

* cited by examiner

*Primary Examiner* — Henry Luong
(74) *Attorney, Agent, or Firm* — Arch & Lake LLP

(57) ABSTRACT

A wireless control switch is provided, which includes: a controller having a wireless communication function, at least one switch module arranged between two connection terminals, and an independent power supply for supplying power to the controller. Each switch module includes a relay and a two-way mechanical switch, a control terminal of the relay is connected to a control pin of the controller. The two-way mechanical switch includes a first group of changeover switches and a second group of changeover switches, an open or closed state of the first group of changeover switches being synchronized with that of the second group of changeover switches. The controller is configured to output a relay holding signal to the relay according to the open or closed state of the first group of changeover switches and a received wireless control signal, to control connection/disconnection between the two connection terminals.

8 Claims, 9 Drawing Sheets

WIRELESS CONTROL SWITCH AND WIRELESS CONTROL METHOD

CROSS-REFERENCE TO RELATED APPLICATION

This application is based upon and claims benefit to Chinese Patent Application No. 201910122674.1, filed on Feb. 15, 2019, the entire contents of which are incorporated herein by reference.

TECHNICAL FIELD

The disclosure relates to the field of intelligent control, and more particularly to a wireless control switch and a wireless control method.

BACKGROUND

A wireless control switch is a switch having a wireless control function and is one of the important components in smart homes. With the wireless control function, a user remotely controls the wireless control switch to be turned on or turned off through a remote control device such as a mobile phone, a tablet or a computer, to remotely control electric equipment.

In the related art, the wireless control switch is connected in series to a circuit, and power is supplied to a wireless chip in the wireless control switch through a power obtaining circuit. Since the wireless control switch is connected in series to controlled equipment, a weak current flows through the controlled electric equipment when the power obtaining circuit obtains power (regardless of whether the electric equipment is in operation).

When the electric equipment is low-power equipment, such as a light emitting diode (LED) of 2 W, the weak current may inevitably cause the LED to flicker.

SUMMARY

According to a first aspect of the disclosure, a wireless control switch is provided. The wireless control switch includes: a controller having a wireless communication function, at least one switch module arranged between two connection terminals, and an independent power supply for supplying power to the controller, where each switch module includes a relay and a two-way mechanical switch, a control terminal of the relay is connected to a control pin of the controller, and the two-way mechanical switch includes a first group of changeover switches and a second group of changeover switches, an open or closed state of the first group of changeover switches being synchronized with an open or closed state of the second group of changeover switches; the first group of changeover switches is configured to control connection or disconnection between the two connection terminals in response to an external operation signal; the controller is configured to acquire the open or closed state of the first group of changeover switches based on the open or closed state of the second group of changeover switches, and output a relay holding signal to the relay according to the acquire open or closed state and a received wireless control signal; and the relay is configured to control connection or disconnection between the two connection terminals in response to the relay holding signal.

According to a second aspect of the disclosure, a wireless control method performed in a wireless control switch is provided, where the wireless control switch includes a controller having a wireless communication function, at least one switch module arranged between two connection terminals, and an independent power supply for supplying power to the controller. Each switch module includes a relay and a two-way mechanical switch, a control terminal of the relay is connected to a control pin of the controller, and the two-way mechanical switch includes a first group of changeover switches and a second group of changeover switches, an open or closed state of the first group of changeover switches being synchronized with an open or closed state of the second group of changeover switches. The first group of changeover switches includes a first movable terminal, a first fixed terminal and a second fixed terminal, and the relay includes a relay movable terminal, a first relay fixed terminal and a second relay fixed terminal, where the first movable terminal is connected to the relay movable terminal; the first fixed terminal and the first relay fixed terminal are both connected to a first connection terminal of the two connection terminals; and the second fixed terminal and the second relay fixed terminal are both connected to a second connection terminal of the two connection terminals. The second group of changeover switches includes a second movable terminal, a third fixed terminal and a fourth fixed terminal, where the second movable terminal is connected to a power pin of the independent power supply, the third fixed terminal is connected to a first input pin of the controller, and the fourth fixed terminal is connected to a second input pin of the controller. The wireless control method includes: receiving, by the controller, a turning-on/turning-off instruction; reading, by the controller, the instruction as turning electric equipment on, the electric equipment being connected to the second connection terminal of the two connection terminals; reading, by the controller, a position of the two-way mechanical switch; in responsive to that the second movable terminal is connected to the third fixed terminal, controlling, by the controller, the relay movable terminal of the relay through the control pin, to switch the relay movable terminal to be connected to the second relay fixed terminal, for completing an operation of turning the electric equipment on; and in responsive to that the second movable terminal is connected to the fourth fixed terminal, controlling, by the controller, the relay movable terminal of the relay through the control pin, to switch the relay movable terminal to be connected to the first relay fixed terminal, for completing the operation of turning the electric equipment on.

According to a third aspect of the disclosure, a wireless control method performed in a wireless control switch is provided, where the wireless control switch includes a controller having a wireless communication function, at least one switch module arranged between two connection terminals, and an independent power supply for supplying power to the controller. Each switch module includes a relay and a two-way mechanical switch, a control terminal of the relay is connected to a control pin of the controller, and the two-way mechanical switch includes a first group of changeover switches and a second group of changeover switches, an open or closed state of the first group of changeover switches being synchronized with an open or closed state of the second group of changeover switches. The first group of changeover switches includes a first movable terminal, a first fixed terminal and a second fixed terminal, and the relay includes a relay movable terminal, a first relay fixed terminal and a second relay fixed terminal; where the first movable terminal is connected to the relay movable terminal; the first fixed terminal and the first relay fixed terminal are both connected to a first connection terminal of the two connection terminals; and the second fixed terminal and the second relay fixed terminal are both connected to a second connection terminal of the two connection terminals. The second group of changeover switches includes a second movable terminal, a third fixed terminal and a fourth fixed terminal; where the second movable terminal is connected to a power pin of the independent power supply, the third fixed terminal is connected to a first input pin of the controller, and the fourth fixed terminal is connected to a second input pin of the controller. The wireless control method includes: receiving, by the controller, a turning-on/turning-off instruction; reading, by the controller, the instruction as turning electric equipment off, the electric equipment being connected to the second connection terminal of the two connection terminals; reading, by the controller, a position of the two-way mechanical switch; in responsive to that the second movable terminal is connected to the fourth fixed terminal, controlling, by the controller, the relay movable terminal of the relay through the control pin, to switch the relay movable terminal to be connected to the second relay fixed terminal, for completing an operation of turning the electric equipment off; and in responsive to that the second movable terminal is connected to the third fixed terminal, controlling, by the controller, the relay movable terminal of the relay through the control pin, to switch the relay movable terminal to be connected to the first relay fixed terminal, for completing the operation of turning the electric equipment off.

It should be understood that the above general descriptions and the following detailed descriptions are only exemplary and explanatory, rather than limiting the disclosure.

BRIEF DESCRIPTION OF THE DRAWINGS

The accompanying drawings, which are incorporated in the specification and constitute a part of the specification, illustrate the examples conforming to the disclosure and, together with the description, serve to explain the principles of the disclosure.

DETAILED DESCRIPTION

Reference is made in detail to exemplary aspects, examples of which are illustrated in the accompanying drawings. The following description refers to the accompanying drawings in which the same numbers in different drawings represent the same or similar elements unless otherwise represented. The implementations described in the following examples do not represent all implementations conforming to the disclosure. Instead, the implementations are merely examples of apparatuses and methods conforming to some aspects of the disclosure.

The terminology used in the present disclosure is for the purpose of describing particular examples only and is not intended to limit the present disclosure. As used in this disclosure and the appended claims, the singular forms "a", "an", and "the" are intended to include the plural forms as well, unless the context clearly indicates otherwise.

It should be understood that, although the terms "first," "second," "third," and the like may be used herein to describe various information, the information should not be limited by these terms. These terms are only used to distinguish one category of information from another. For example, without departing from the scope of the present disclosure, first information may be termed as second information; and similarly, second information may also be termed as first information. As used herein, the term "if" may be understood to mean "when" or "upon" or "in response to" depending on the context.

Figure 1:
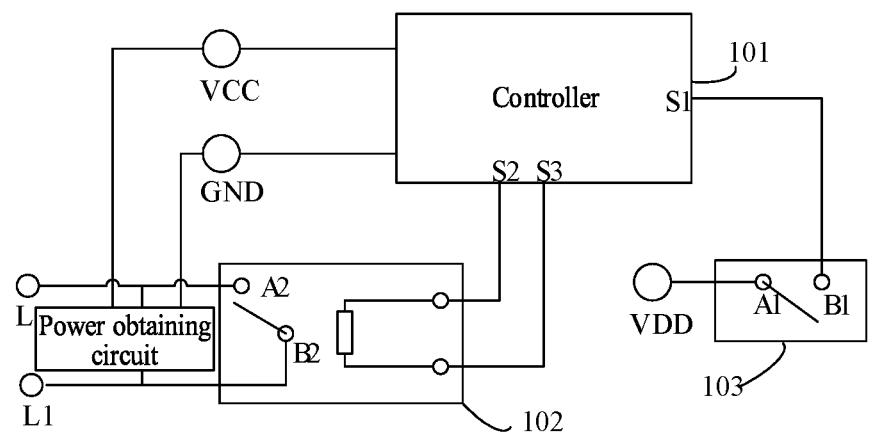
FIG. 1 is a schematic block diagram of a wireless control switch.

A single-live wire type wireless control switch is connected in series to a live wire, and power is supplied to the wireless control switch by collecting a dropout current of the live wire. FIG. 1 shows a schematic circuit diagram of a wireless control switch. The wireless control switch includes a controller 101. The controller 101 may be a micro-control component having a wireless communication function. The controller 101 includes a pin VCC for power supply, a pin GND, an input pin S1, an output pin S2 and an output pin S3.

The controller 101 is connected to a fixed terminal B1 of a mechanical switch 103 through the input pin S1. The mechanical switch 103 further includes a fixed terminal A1. The fixed terminal A1 is connected to a power supply VDD. A movable terminal for connection or disconnection is arranged between the fixed terminal A1 and the fixed terminal B1. When the movable terminal connects the fixed terminal A1 with the fixed terminal B1, a high level of the power supply is transferred to the controller 101 through the pin S1.

The output pin S2 and the output pin S3 of the controller 101 are connected to input pins of a relay 102. A fixed terminal A2 of the relay is connected to a first connection terminal L. A fixed terminal B2 of the relay is connected to a second connection terminal L1. The first connection terminal L is connected to a live wire. The second connection terminal L1 is connected to electric equipment.

A power obtaining circuit is further arranged in series between the first connection terminal L and the second connection terminal L1. Output terminals of the power obtaining circuit are connected to the pin VCC and the pin GND. The power obtaining circuit is configured to supply power to the controller 101.

In a wireless control mode, when the controller 101 controls a movable terminal in the relay to connect the fixed terminal A2 with the fixed terminal B2, the electric equipment is in an operation state. When the controller 101 controls the movable terminal in the relay to disconnect the fixed terminal A2 from the fixed terminal B2, the electric equipment does not operate.

In a manual control mode, when the fixed terminal A1 and the fixed terminal B1 of the mechanical switch 103 are connected, a high level signal is detected by the pin S1 of the controller 101, and the controller 101 controls the movable terminal of the relay to connect the fixed terminal A2 with the fixed terminal B2 through the output pin S2 and the output pin S3, to control the electric equipment to be powered on and operate. When the fixed terminal A1 and the fixed terminal B1 of the mechanical switch 103 are disconnected, a change from the high level signal to the low level signal is detected by the pin S1 of the controller 101, and the controller 101 controls the movable terminal of the relay to disconnect the fixed terminal A2 from the fixed terminal B2 through the output pin S2 and the output pin S3, to control the electric equipment to be powered off and stop operating.

Since the wireless control switch in FIG. 1 is connected with two connection terminals, the two connection terminals being connection terminals for connecting in series with the live wire and including the first connection terminal L and the second connection terminal L1, supplying power to the controller 101 through the power obtaining circuit can generate a weak current in the circuitry. Taking an electric lamp as an example of the electric equipment, a weak current is generated in a neutral-live wire when the lamp is turned off, which causes the lamp to flicker. Taking a wireless control switch of a certain type as an example, due to the principle of serial-connection power obtaining, there is a requirement for a minimum power of the lamp. The power of a common lamp is required to be greater than 3 W. The total power is required to be less than 1500 W, under limitation of relative low power consumption of the relay in the wireless control switch. With continuous optimization of wireless communication protocols and continuous decrease in hardware power consumption, flicker of the lamp can be improved, but a compatibility problem of this type of wireless control switch cannot be completely resolved.

Figure 2:
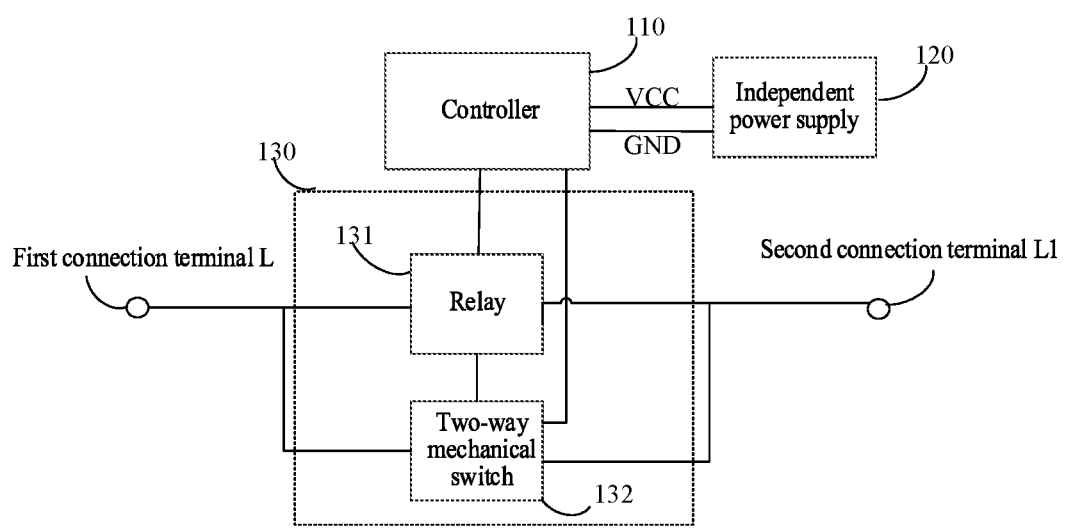
FIG. 2 is a schematic diagram showing a wireless control switch according to an example of the disclosure.

FIG. 2 is a structural block diagram of a wireless control switch according to an example of the disclosure. The wireless control switch includes: a controller 110, an independent power supply 120 and at least one switch module 130 provided between a first connection terminal L and a second connection terminal L1.

The controller 110 may be a microprocessor having a wireless communication function. Optionally, the controller 110 is a processing component capable of receiving a signal, processing the signal and sending an instruction. The controller may also be a controller capable of executing a preset instruction. The controller may also be a controller capable of receiving, processing or sending an instruction signal at regular intervals. The controller 110 is electrically connected to the independent power supply 120 and the switch modules 130.

Optionally, the controller 110 having a wireless communication function is a controller having a Zigbee function, and/or a controller having a BLE function; and/or a controller having a WiFi function, and/or a controller having an infrared remote control function.

The independent power supply 120 may be a rechargeable battery or a battery case composed of disposable dry batteries. The independent power supply 120 is configured to supply power to the controller 110.

Each switch module 130 includes a relay 131 and a two-way mechanical switch 132. The relay 131 in each switch module 130 may be one of a magnetically-conductive relay, an inductive relay, an electric relay, an electronic relay, or an electromagnetic relay. Different types of relays 131 may be used in different switch modules 130. In the example, a magnetically-conductive relay is used as an example. A control terminal of the relay 131 is connected to a control pin of the controller 110. The two-way mechanical switch 132 includes a first group of changeover switches and a second group of changeover switches (not shown in FIG. 1), and an open or closed state of the first group of changeover switches are synchronized with an open or closed state of the second group of changeover switches. That is, when the first group of changeover switches is in a closed state, the second group of changeover switches is also in the closed state. When the first group of changeover switches is in an open state, the second group of changeover switches is also in the open state. The first group of changeover switches and the second group of changeover switches are always maintained in the same state.

The second group of changeover switches is connected to an input pin of the controller.

The wireless control switch in the example has two operating modes, which include a wireless control mode and a manual control mode.

In the wireless control mode, the controller 110 receives a wireless signal, which may be sent by a device such as a mobile phone or a remote controller. There are two types of wireless signals including a turning-on control signal and a turning-off control signal. When the wireless signal received by the controller 110 is the turning-on control signal, the controller 110 determines the open or closed state of the two-way mechanical switch 132 based on the open or closed state of the second group of changeover switches, and the controller 110 controls the relay 131 to be turned on or off by the control pin according to different states.

In the manual control mode, the two-way mechanical switch 132 can be manually controlled to change its connection state by manually changing the open or closed state of the first group of changeover switches.

Even when the independent power supply is not powered, the two-way mechanical switch 132 can be controlled manually, to control connection or disconnection between the first connection terminal L and the second connection terminal L1.

According to the disclosure, an independent power supply is provided to supply power to the controller, and the wireless control switch is not required to be powered by a single live wire, thereby avoiding the problem that a weak current flows through electric equipment caused by obtaining power using the single live wire, and removing limitation on rated power of the electric equipment. Moreover, since the first group of changeover switches in the two-way mechanical switch can operate without being powered, a user can manually turn on or turn off the electric equipment through the first group of changeover switches even if the independent power supply does not supply power.

Figure 3:
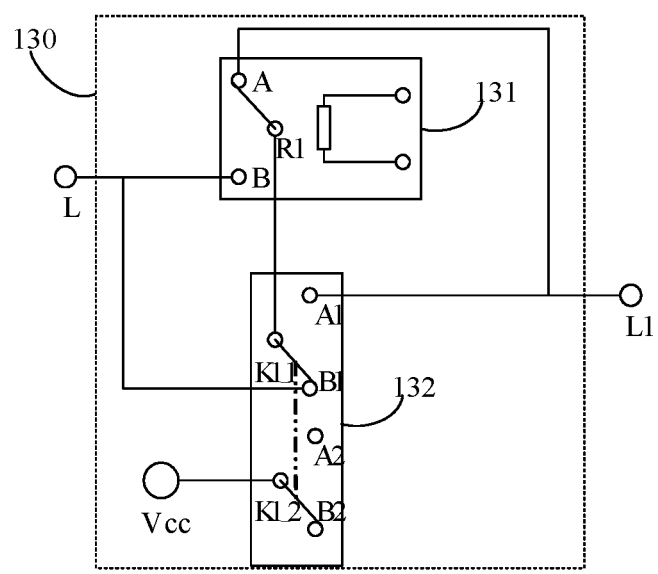
FIG. 3 is a schematic circuit diagram of a switch module of a wireless control switch according to an example.

Optionally, FIG. 3 shows a schematic structural diagram of a switch module according to an example of the disclosure. The switch module 130 includes a relay 131 and a two-way mechanical switch 132.

Optionally, the two-way mechanical switch 132 may be a double-pole double-throw switch, which includes a first group of changeover switches and a second group of changeover switches. The first group of changeover switches is provided with a first movable terminal K1_1, a first fixed terminal A1 and a second fixed terminal B1. The second group of changeover switches includes a second movable terminal K1_2, a third fixed terminal A2 and a fourth fixed terminal B2. Optionally, the first fixed terminal A1 is connected to the second connection terminal L1, the second fixed terminal B1 is connected to the first connection terminal L, and the first movable terminal K1_1 is movable between the two fixed terminals, to select the fixed terminal to be connected.

The relay includes a relay movable terminal R1, a first relay fixed terminal A and a second relay fixed terminal B. Optionally, the first relay fixed terminal A is connected to the second connection terminal L1, and the second relay fixed terminal B is connected to the first connection terminal L.

The relay movable terminal R1 is movable between the two relay fixed terminals, to select the relay fixed terminal to be connected.

The first movable terminal K1_1 and the relay movable terminal R1 are electrically connected by a wire.

Two circuits are included between the first connection terminal L and the second connection terminal L1, and the relay 131 and the two-way mechanical switch 132 are respectively arranged in the two circuits. Since the first movable terminal K1_1 and the relay movable terminal R1 are both selection switches, the circuit in which the first movable terminal K1_1 or the relay movable terminal R1 is arranged cannot connect the first connection terminal L with the second connection terminal L1 by only the first movable terminal or only the relay movable terminal. Therefore, a wire between the first movable terminal K1_1 and the relay movable terminal R1 is required, so that the first connection terminal L and the second connection terminal L1 can be connected with cooperation between the first movable terminal and the relay movable terminal.

One switch module 130 is provided as an example below.

Figure 4:
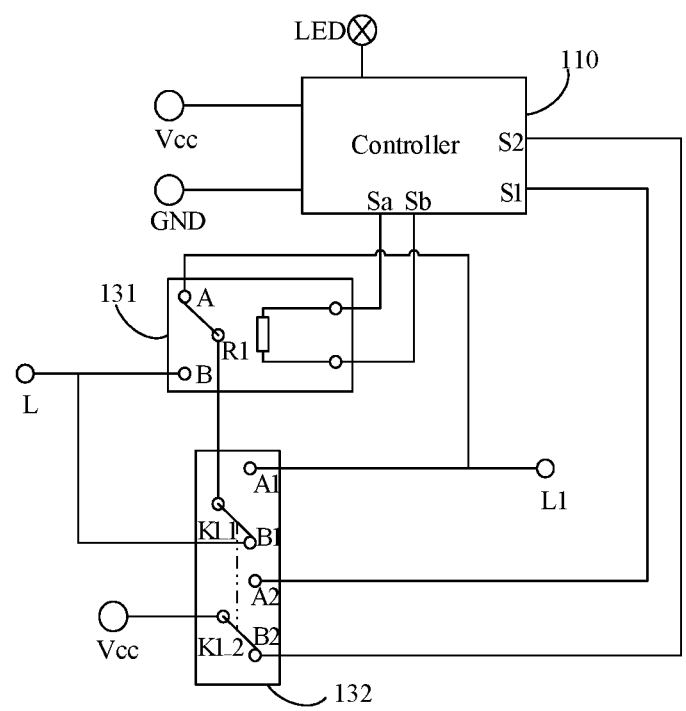
FIG. 4 is a schematic diagram showing a wireless control switch according to another example.

FIG. 4 shows a schematic structural diagram of a wireless control switch according to an example. Based on the structure of the switch module in FIG. 3, the second movable terminal K1_2 is connected to a power pin (Vcc) of the independent power supply 120, the third fixed terminal A2 is connected to a first input pin S1 of the controller 110, and the fourth fixed terminal B2 is connected to a second input pin S2 of the controller 110.

Optionally, the first movable terminal K1_1 and the second movable terminal K1_2 may move synchronously. That is, the first movable terminal K1_1 is connected to the first fixed terminal A1 while the second movable terminal K1_2 and the third movable terminal A2 are connected. Then, an electric signal of the second movable terminal K1_2 enters the first input pin S1 of the controller 110 along a line, and the controller 110 acquires that a current location or position of the first movable terminal K1_1 is connecting with the first fixed terminal A1. When the first movable terminal K1_1 is connected to the second fixed terminal B1, the second movable terminal K1_2 and the fourth fixed terminal B2 are connected, then an electric signal at the second movable terminal K1_2 enters the second input pin S2 in the controller 110 along a line, and the controller 110 acquires that the current position of the first movable terminal K1_1 is connecting with the second fixed terminal B1. The relay is controlled to be turned on or off by control pins Sa and Sb.

When an electric signal detected by the first input pin S1 of the controller 110 is a first electric signal, and an electric signal detected by the second input pin S2 of the controller 110 is a second electric signal, the controller considers or determines that the current position of the first movable terminal K1_1 is connecting with the first fixed terminal A1, and here, the first electric signal may be a high level signal while the second electric signal is a low level signal. When the electric signal detected by the first input pin S1 of the controller 110 is the second electric signal, and the electric signal detected by the second input pin S2 is the first electric signal, the controller considers or determines that the current position of the first movable terminal K1_1 is connecting with the second fixed terminal B1.

Reference is made to Table 1 for the control logic of the wireless control switch.

TABLE 1

| Switch state | Current state | Turning a lamp on | Turning a lamp off |
| --- | --- | --- | --- |
| Wireless control | K1_2-B2 | R1-A | R1-B |
|  | K1_2-A2 | R1-B | R1-A |
| Manual control | R1-A | K1_1-B1 | K1_1-A1 |
|  | R1-B | K1_1-A1 | K1_1-B1 |

In conjunction with Table 1 and FIG. 4, a case that an electric lamp is the electric equipment and the electric lamp is controlled to be turned on or turned off is taken as an example to illustrate operating modes of the wireless control switch. The wireless control switch in the example includes two operating modes, including a wireless control mode and a manual control mode.

In the wireless control mode, the controller 110 receives a wireless control signal from a device such as a mobile phone or a remote controller. The wireless control signal may indicate turning the lamp on or turning the lamp off. In responsive to that the wireless control signal indicates turning the lamp on, the controller 110 first detects a current open or closed state of the two-way mechanical switch 132 (for example, a double-pole double-throw switch). In responsive to that the second movable terminal K1_2 is connected to the fourth fixed terminal B2, the controller 110 controls the relay movable terminal R1 and the first relay fixed terminal A to be connected. In this case, the two connection terminals L, L1 are connected, and thus the electric lamp is turned on. In responsive to that the second movable terminal K1_2 is connected to the third fixed terminal A2, the controller 110 controls the relay movable terminal R1 and the second relay fixed terminal B to be connected. In this case, the two connection terminals L, L1 are connected, and thus the electric lamp is turned on.

In the wireless control mode, in responsive to that the wireless control signal indicates turning the lamp off, the controller 110 first detects a current open or closed state of the two-way mechanical switch 132 (for example, a double-pole double-throw switch). In responsive to that the second movable terminal K1_2 is connected to the fourth fixed terminal B2, the controller 110 controls the relay movable terminal R1 and the second relay fixed terminal B to be connected. In this case, the two connection terminals L, L1 are disconnected, and thus the electric lamp is turned off. In responsive to that the second movable terminal K1_2 is connected to the third fixed terminal A2, the controller 110 controls the relay movable terminal R1 and the first relay fixed terminal A to be connected. In this case, the two connection terminals L, L1 are disconnected, and thus the electric lamp is turned off.

Here, the open or closed state of the two-way mechanical switch 132 is equivalent to the open or closed state of either the first group of changeover switches or the second group of changeover switches. The first group of changeover switches and the second group of the changeover switches may be in open states when the first movable terminal K1_1 is connected to the second fixed terminal B1 and the second movable terminal K1_2 is connected to the fourth fixed terminal B2, and may be in closed states when the first movable terminal K1_1 is connected to the first fixed terminal A1 and the second movable terminal K1_2 is connected to the third fixed terminal A2, or vice versa. Thus, the controller 110 acquires the open or closed state of the first group of changeover switches (or the open or closed state of the two-way mechanical switch 132) based on the open or closed state of the second group of changeover switches, and output a relay holding signal to the relay according to the open or closed state and the received wireless control signal; and the relay is configured to control connection or disconnection between the two connection terminals in response to the relay holding signal.

In the manual control mode, in responsive to that the relay movable terminal R1 is connected to the first relay fixed terminal A, the double-pole double-throw switch is manually controlled to connect the first movable terminal K1_1 and the second fixed terminal B1 for a state of turning the lamp on, or to connect the first movable terminal K1_1 and the first fixed terminal A1 for a state of turning the lamp off.

In the manual control mode, in responsive to that the relay movable terminal R1 is connected to the second relay fixed terminal B, the double-pole double-throw switch is manually controlled to connect the first movable terminal K1_1 and the second fixed terminal B1 for a state of turning the lamp off, or to connect the first movable terminal K1_1 and the first fixed terminal A1 for a state of turning the lamp on.

Optionally, the wireless control switch may further include LED indicator lamps connected to the controller 110. The number of the LED indicator lamps is the same as the number of the switch modules. Each LED indicator lamp corresponds to one switch module. A turned-on/turned-off state of the switch module is indicated by a lighted/dark state of the LED indicator lamp corresponding to the switch module. For example, LED1 corresponds to a first switch module 130. In responsive to that the first switch module 130 is in a turned-on state (i.e., a state of the first switch module in which the first switch module turns the electric equipment on), the controller 110 lights LED 1. LED1 may also be directly connected to the first switch module 130. When the first switch module 130 is turned on, LED1 is lighted by a conduction current, for indication.

Figure 5:
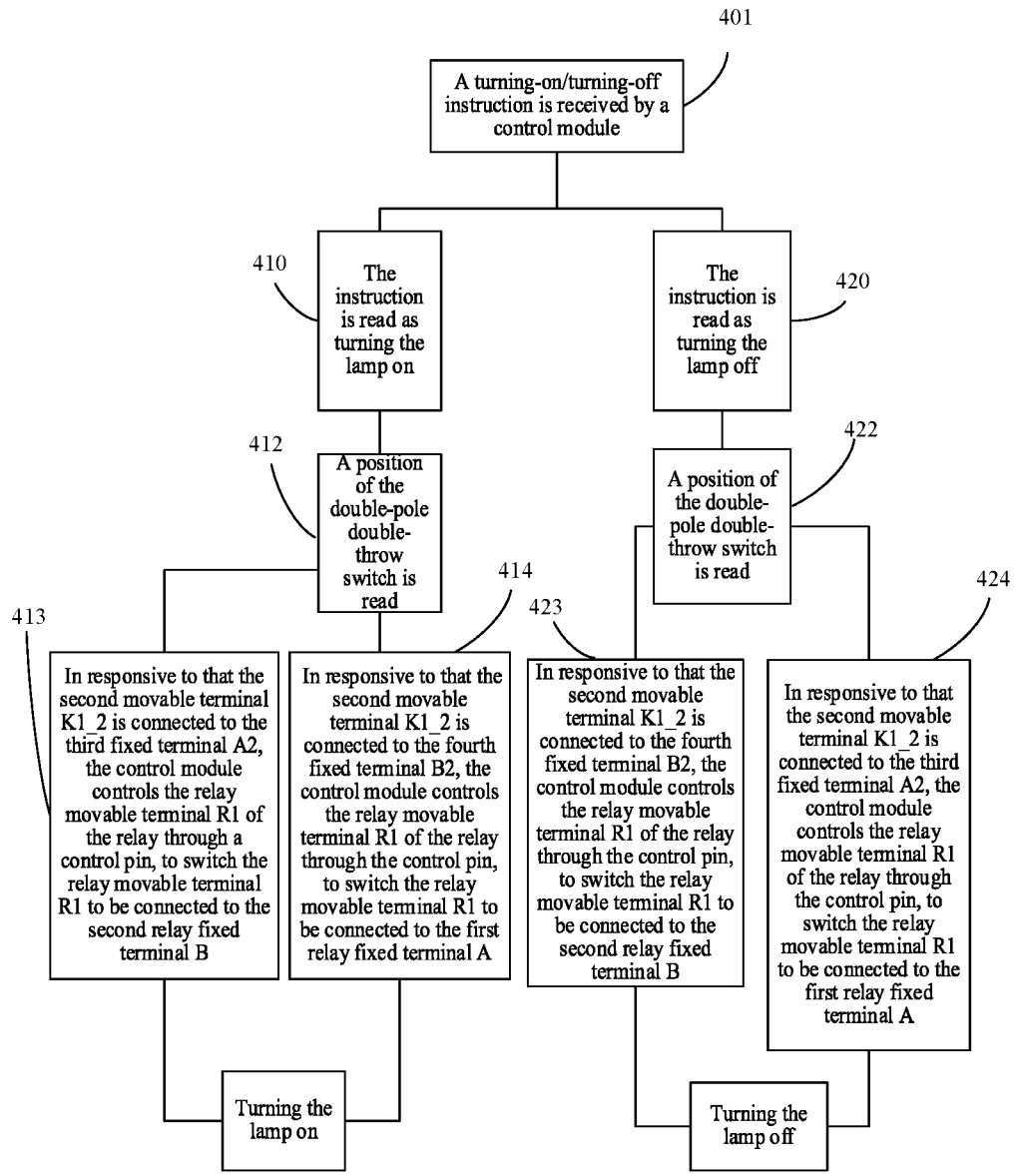
FIG. 5 is a control flowchart of a wireless control switch according to an example.

FIG. 5 shows a flowchart of wirelessly controlling to turn on or off a lamp using a wireless control switch according to an example. The example is illustrated by controlling to turn on or off the electric lamp. The flowchart may include the following operations 401 to 424.

At block 401, the controller receives a turning-on/turning-off instruction.

The turning-on/turning-off instruction may be an instruction signal sent to the controller by a device such as a mobile phone or a remote controller. The instruction signal may include at least "turning the lamp on" and "turning the lamp off".

At block 410, the instruction is read as turning the lamp on.

At block 412, a position of the double-pole double-throw switch is read.

The controller determines a current position of the second movable terminal K1_2 (i.e., a current open or closed state of the double-pole double-throw switch) in the double-pole double-throw switch based on an inputted high level and a pin corresponding to the high level.

At block 413, in responsive to that the second movable terminal K1_2 is connected to the third fixed terminal A2, the controller controls the relay movable terminal R1 of the relay through a control pin, to switch the relay movable terminal R1 to be connected to the second relay fixed terminal B, for completing the operation of turning the lamp on.

At block 414, in responsive to that the second movable terminal K1_2 is connected to the fourth fixed terminal B2, the controller controls the relay movable terminal R1 of the relay through the control pin, to switch the relay movable terminal R1 to be connected to the first relay fixed terminal A, for completing the operation of turning the lamp on.

When the instruction received by the control indicates "turning the lamp off", the following operations 420 to 424 are performed:

At block 420, the instruction is read as turning the lamp off.

At block 422, a position of the double-pole double-throw switch is read.

The controller determines a current position of the second movable terminal K1_2 (i.e., a current open or closed state of the double-pole double-throw switch) in the double-pole double-throw switch based on an inputted high level and a pin corresponding to the high level.

At block 423, in responsive to that the second movable terminal K1_2 is connected to the fourth fixed terminal B2, the controller controls the relay movable terminal R1 of the relay through the control pin, to switch the relay movable terminal R1 to be connected to the second relay fixed terminal B, for completing the operation of turning the lamp off.

At block 424, in responsive to that the second movable terminal K1_2 is connected to the third fixed terminal A2, the controller controls the relay movable terminal R1 of the relay through the control pin, to switch the relay movable terminal R1 to be connected to the first relay fixed terminal A, for completing the operation of turning the lamp off.

In the example, the first movable terminal and the second movable terminal which are synchronously moved are arranged in the two-way mechanical switch. The second movable terminal is connected to an input pin of the controller, and a position of the first movable terminal is determined in response to an electric signal received by the input pin, so that the controller sends a corresponding instruction signal (i.e., the relay holding signal) to the relay based on the position of the first movable terminal and the wireless control signal upon receiving the wireless control signal.

Two switch modules 130 are provided as an example below.

Figure 6:
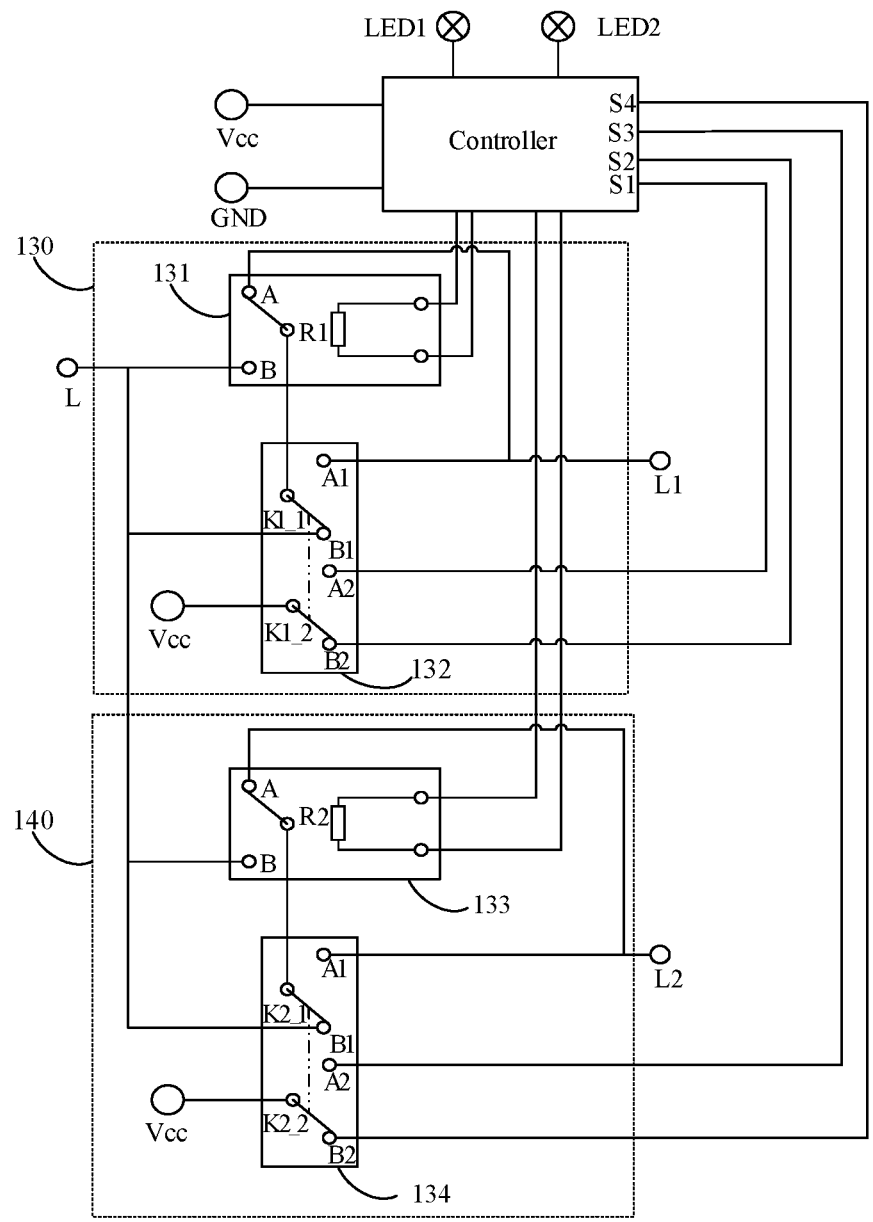
FIG. 6 is a schematic diagram showing a wireless control switch according to another example.

FIG. 6 shows a schematic circuit diagram of two switch modules in parallel connection according to an example of the disclosure. There may be multiple switch modules in parallel connection, for example, two switch modules, three switch modules, four switch modules, five switch modules, six switch modules and the like. The number of switch modules in parallel connection is not limited in the disclosure, which may be set according to the practical requirements. The two switch modules include a first switch module 130 and a second switch module 140. Reference may be made to the example as shown in FIG. 3 for a structure of each switch module.

Each of the first switch module 130 and the second switch module 140 includes two fixed terminals for connecting to input terminals of the controller, and the four fixed terminals are respectively connected to a first input pin S1, a second input pin S2, a third input pin S3, and a fourth input pin S4 of the controller. The first input pin S1 and the second input pin S2 are respectively connected to the fixed terminals of the first switch module 130. The third input pin S3 and the fourth input pin S4 are respectively connected to the second switch module 140. The controller 110 controls the relays to be turned on or turned off according to corresponding electric signals in the pins and control instructions.

Reference is made to Table 2 for control logic of the wireless control switch.

TABLE 2

| Switch state | Current state | Turning lamp on | Turning lamp off |
| --- | --- | --- | --- |
| Wireless control for L1 | K1_2-B2 | R1-A | R1-B |
| | K1_2-A2 | R1-B | R1-A |
| Manual control for L1 | R1-A | K1_1-B1 | K1_1-A1 |
| | R1-B | K1_1-A1 | K1_1-B1 |
| Wireless control for L2 | K2_2-B2 | R2-A | R2-B |
| | K2_2-A2 | R2-B | R2-A |
| Manual control for L2 | R2-A | K2_2-B1 | K2_2-A1 |
| | R2-B | K2_2-A1 | K2_2-B1 |

The control logic in Table 2 is the same as the control logic in Table 1. For related content, reference may be made to the corresponding example in Table 1.

It should be noted that multiple switch modules arranged in parallel may have the same control logic or different control logics, as long as the correct logic capable of realizing the above functions is set in advance.

Optionally, the wireless control switch may further include LED indicator lamps connected to the controller 110. The number of the LED indicator lamps is the same as the number of the switch modules. Each LED indicator lamp corresponds to a switch module. A turned-on/turned-off state of the switch module is indicated by a lighted/dark state of the LED indicator lamp corresponding to the switch module. For example, LED1 corresponds to a first switch module 130. When the first switch module 130 is in a turned-on state, the controller 110 lights LED 1. LED1 may also be directly connected to the first switch module 130. When the first switch module 130 is turned on, LED1 is lighted by a conduction current, for indication.

In the examples, the controller 110 and the independent power supply 120 are used to simultaneously control multiple switch modules to be turned on or turned off. Due to the design of the two-way mechanical switch, a user still controls the connection or disconnection between the two connection terminals by the two-way mechanical switch when the independent power supply does not supply power, thereby avoiding the problem that the wireless control switch cannot operate in a case that the independent power supply does not supply power.

Figure 7:
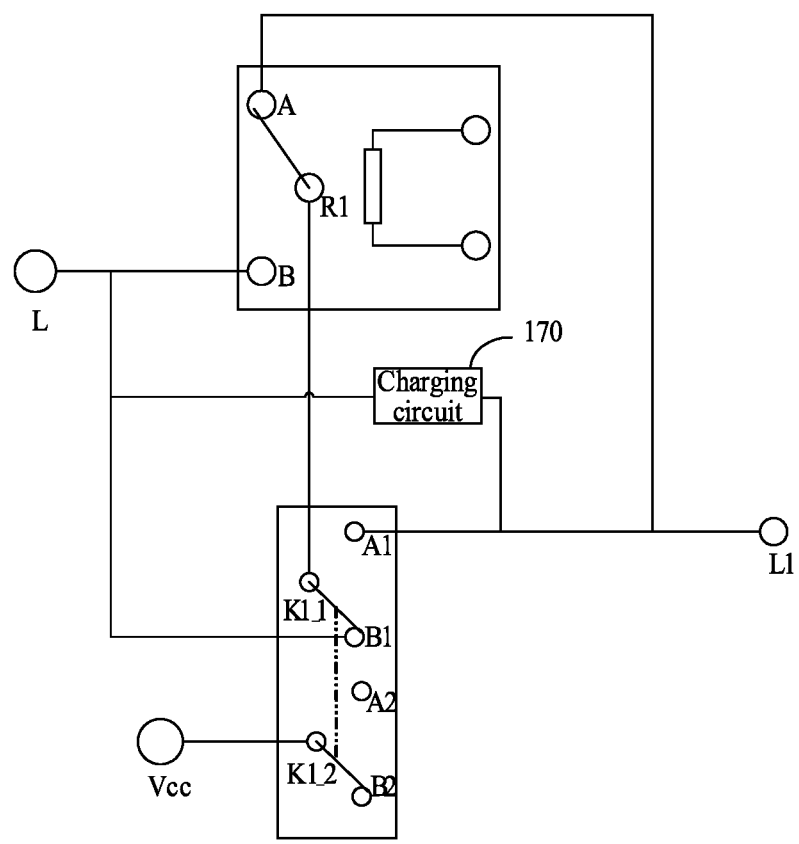
FIG. 7 is a schematic diagram showing a wireless control switch according to yet another example.

FIG. 7 is a schematic circuit diagram of a wireless control switch provided by still another example. A charging circuit 170 is arranged between the first connection terminal L and the second connection terminal L1. The charging circuit 170 is connected to the independent power supply 120. The independent power supply 120 may be a rechargeable battery, and the charging circuit 170 may obtain power from circuitry to charge the independent power supply 120. In a possible implementation, the charging circuit 170 includes a module having an automatic power-off function. The charging circuit 170 automatically powers off to stop charging the independent power supply 120 when the battery is fully charged.

It should be noted that the charging circuit is not limited in the disclosure. The charging circuit may be designed according to needs, or may be an existing mature charging circuit module, such as a charging template conforming to a current Dialog-based Qualcomm QC3.0 fast charging protocol or a power-delivery (PD) protocol-based charger circuit.

According to example of the disclosure, the wireless control switch is provided with a charging circuit, which may charge the independent power supply. The wireless control switch uses power supplied by the independent power supply to supply power to the controller, so that a replacement frequency of battery can be effectively reduced without affecting the use of the wireless control switch.

Figure 8:
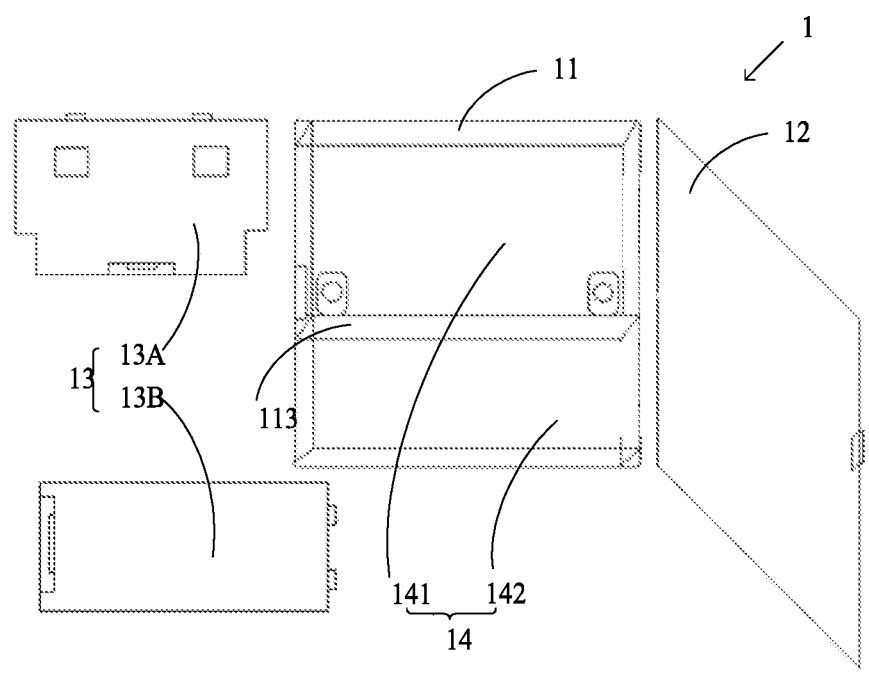
FIG. 8 is a schematic exploded structure diagram of a wireless wall switch according to an example.
Figure 9:
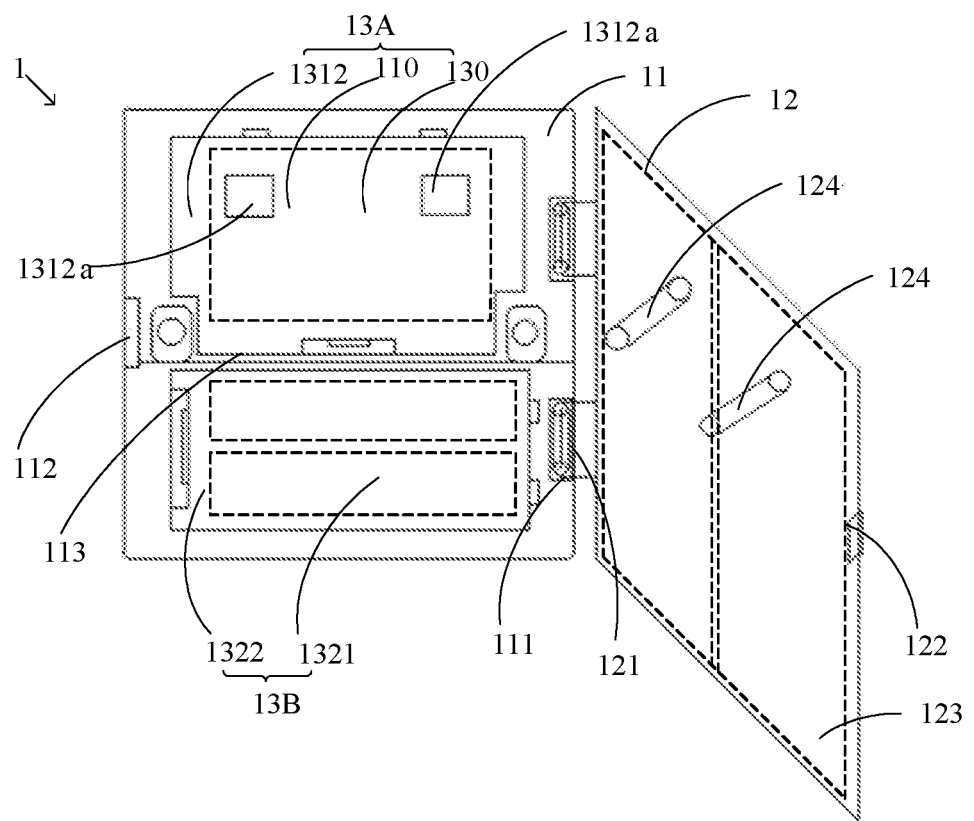
FIG. 9 is a schematic assembly structure diagram of a wireless wall switch according to an example.

In the disclosure, the wireless control switch may be implemented as a wireless wall switch adopting a housing of an 86-type, which may also be referred as an 86-Type Junction Box Case, or an 86-Type Switch Box, etc. FIG. 8 and FIG. 9 are respectively a schematic exploded structure diagram and a schematic assembled structure diagram of a wireless wall switch according to an example of the disclosure.

As shown in FIG. 8 and FIG. 9, a wireless wall switch 1 includes a housing 11, a cover plate 12 and a functional component 13. The cover plate 12 and the housing 11 are assembled to form an assembly space 14. The housing 11 is provided with a partition plate 113. The partition plate 113 partitions the assembly space 14 into a strong electricity bin 141 and a power supply bin 142, which are mutually independent. The functional component 13 may include a strong electricity module 13A and a power supply module 13B.

The strong electricity module 13A may include a controller 110, at least one switch module 130 and a strong electricity cover plate 1312 covering the strong electricity bin 141. The strong electricity cover plate 1312 is fixedly connected to the strong electricity bin 141. That is, the controller 110 and the at least one switch module 130 are assembled in the strong electricity bin 141. In a possible implementation, the strong electricity cover plate 1312 and the strong electricity bin 141 are fixedly installed by the factory, and a user cannot open the strong electricity cover plate, thereby avoiding an electric shock accident, and improving usage safety of the wireless wall switch 1.

The power supply module 13B may include a battery 1321 and a battery cover plate 1322. In the example, a case that the battery 1321 is used as the independent power supply 120 is taken as an example. The battery cover plate 1322 can encapsulate the battery 1321 in the power supply bin 142. That is, the independent power supply 120 is assembled in the power supply bin 142, which not only improves regularity of an internal structural of the wireless wall switch 1, but also shields and protects the battery 1321. It should be noted that the battery 1321 may be an AAA-type, AA-type or other-type dry battery, or may be other type of battery such as a rechargeable battery, which is not limited in the disclosure.

Since the battery 1321 supplies power to the controller 110, the battery 1321 is connected to the controller 110. In an implementation, since the strong electricity bin 141 and the power supply bin 142 are partitioned by the partition plate, a gap may be reserved on a side of the partition plate 113 away from a switch panel, or a hole is reserved in the position of the partition plate 113, in order to ensure the connection between the battery and the controller. A connecting member (such as a conductive wire) connects the battery 1321 and the controller 110 on two sides of the partition plate 113 by passing through a through hole. The gap and the hole reserved in the partition plate, or other reservation manners and reservation positions are not limited in the disclosure, as long as the battery 1321 is configured to supply power to the controller 110, and a partition effect of the partition plate is not affected. That is, the partition plate 113 is provided to partition the assembly space 14 formed by assembling the cover plate 12 and the housing 11 into the strong electricity bin 141 and the power supply bin 142, so that the strong electricity module 13A and the power supply module 13B of the functional component 13 can separate strong electricity from weak electricity.

Therefore, with the above structural arrangement, maintenance convenience and usage safety of the functional component 13, and user experience of the wireless wall switch 1 can be improved.

As shown in FIG. 9, the switch panel may be an openable cover plate 12. One side of the cover plate 12 may has a buckle structure, and the other side may have a hinge structure. In an implementation, the cover plate 12 may further include a hinge structure 121 arranged on a first side of the cover plate 12, and a buckle structure 122 arranged on a second side of the cover plate 12. The first side and the second side are respectively arranged on opposite sides of the cover plate (left and right sides or upper and lower sides, left and right sides are taken as an example in FIG. 9), so that the cover plate 12 is firmly fixed. The first side and the second side may also be arranged on two adjacent sides of the cover plate 1, and a position relationship between the hinge structure 121 and the buckle structure 122 is set according to the actual structure.

A first matching portion 111 and a second matching portion 112 are arranged at positions of the housing 11 corresponding to the hinge structure 121 and the buckle structure 122. The hinge structure 121 is matched with the first matching portion 111 through a hinge, and the buckle structure 122 is matched with the second matching portion 112 through a buckle. The hinge structure 121 and the buckle structure 122 are provided for the cover plate 12 of the wireless wall switch 1, and the hinge structure 121 and the buckle structure 122 are matched with the housing 11, so that the cover plate 12 is horizontally open or closed by operating the buckle structure 122. The above structure of the cover plate 12 facilitates replacement of the independent power supply 120, thereby improving the maintenance and replacement convenience of the functional component 13, as well as overall structural reliability and user experience of the wireless wall switch 1.

In an implementation, the switch panel of the wireless wall switch in the disclosure is provided with panel buttons 123 corresponding to the first group of changeover switches. The state of the first group of changeover switches can be controlled by manually operating the panel buttons 123, thereby controlling the circuitry to be conductive or non-conductive. The number of panel buttons 123 may be the same as the number of the first groups of changeover switches. The arrangement of the panel buttons 123 may also be set according to actual requirements, which is not limited in the disclosure.

Correspondingly, a back surface of the cover plate 12 is further provided with trigger members 124 having a one-to-one correspondence with the panel buttons 123. Trigger openings 1312a also have a one-to-one correspondence with the trigger members 124. In a case of multiple panel buttons 123, multiple trigger members 124 are arranged to implement trigger control for the panel buttons 123 corresponding to the trigger members. The trigger member 124 may be in a cylindrical shape or other prismatic structure that protrudes from the back surface of the switch panel 12. A cross-sectional shape of the trigger opening 1312a may include a closed shape such as a circle, an ellipse, or a regular or irregular polygon, and the cross-sectional shape of the trigger opening 1312a is not limited in the disclosure.

Further, a distance between two points on a cross section of the finger which are farthest from each other may be defined. For example, the distance between the two points on the cross section of the finger of the user which are farthest from each other is d. When the cross-sectional shape of the trigger opening 1312a is a circle, a diameter of the circle may be defined to be smaller than d. When the cross-sectional shape of the trigger opening 1312a is a polygon, a diameter of an inscribed circle of the polygon may be defined to be smaller than d. With the above limitation for the size of the trigger opening 1312a, after the switch panel 12 is open, the finger or another part of a human body is prevented from entering into the exposed trigger opening 1312a due to incorrect operation of the user, thereby improving the usage safety of the wireless wall switch 1.

In the example, the battery cover plate 1322 for replacing the battery is provided in the wireless wall switch disclosed, and the battery cover plate is non-fixedly connected to the power supply bin. That is, the battery cover plate is openable or is detachably connected to the power supply bin. Thus, the battery can be replaced using a simple tool, thereby effectively reducing the operation difficulty of the user.

It will be appreciated that "multiple" mentioned herein means two or more. The term "and/or" is used to describe an association relation of associated objects, which indicates that there may be three relationships. For example, A and/or B may indicate a case that only A exists, a case that both A and B exist simultaneously, and a case that only B exists. The character "/" generally indicates that a relation between a former object and a following object is an "or" relationship.

Other examples of the disclosure are easily conceivable for those skilled in the art from consideration of the specification and with practice of the disclosure disclosed here. The disclosure is intended to cover any variations, usages or adaptations of the disclosure which conform to the general principles thereof and includes common general knowledge and conventional technical means in the technical field not disclosed in the disclosure. The specification and the examples are only considered as exemplary.

It should be understood that the disclosure is not limited to the exact construction described above and illustrated in the accompanying drawings, and various modifications and changes can be made without departing from the scope thereof.

The invention claimed is:

1. A wireless control switch, comprising:
a controller having a wireless communication function, at least one switch module arranged between two connection terminals, and an independent power supply for supplying power to the controller, wherein
said at least one switch module comprises a relay and a two-way mechanical switch, a control terminal of the relay is connected to a control pin of the controller, and the two-way mechanical switch comprises a first group of changeover switches and a second group of changeover switches, an open or closed state of the first group of changeover switches being synchronized with an open or closed state of the second group of changeover switches;
the first group of changeover switches is configured to control connection or disconnection between the two connection terminals in response to an external operation signal;
the controller is configured to acquire the open or closed state of the first group of changeover switches based on the open or closed state of the second group of changeover switches, and output a relay holding signal to the relay according to the acquired open or closed state and a received wireless control signal; and
the relay is configured to control connection or disconnection between the two connection terminals in response to the relay holding signal, wherein:

the first group of changeover switches comprises a first movable terminal, a first fixed terminal and a second fixed terminal, and the relay comprises a relay movable terminal, a first relay fixed terminal and a second relay fixed terminal;

the first movable terminal is connected to the relay movable terminal;

the first fixed terminal and the first relay fixed terminal are both connected to a first connection terminal of the two connection terminals; and the second fixed terminal and the second relay fixed terminal are both connected to a second connection terminal of the two connection terminals.

2. The wireless control switch of claim 1, wherein the second group of changeover switches comprises a second movable terminal, a third fixed terminal and a fourth fixed terminal; and the second movable terminal is connected to a power pin of the independent power supply, the third fixed terminal is connected to a first input pin of the controller, and the fourth fixed terminal is connected to a second input pin of the controller.

3. The wireless control switch of claim 2, wherein the controller is configured to generate a first relay control signal in responsive to that the third fixed terminal is at a high level and the wireless control signal indicates turning on, wherein the first relay control signal is used to control the relay movable terminal and the second relay fixed terminal of the relay to be connected;

the controller is configured to generate a second relay control signal in responsive to that the third fixed terminal is at a high level and the wireless control signal indicates turning off, wherein the second relay control signal is used to control the relay movable terminal and the first relay fixed terminal of the relay to be connected;

the controller is configured to generate a third relay control signal in responsive to that the fourth fixed terminal is at a high level and the wireless control signal indicates turning on, wherein the third relay control signal is used to control the relay movable terminal and the first relay fixed terminal of the relay to be connected; and the controller is configured to generate a fourth relay control signal in responsive to that the fourth fixed terminal is at a high level and the wireless control signal indicates turning off, wherein the fourth relay control signal is used to control the relay movable terminal and the second relay fixed terminal of the relay to be connected.

4. The wireless control switch of claim 1, further comprising indicator lamps connected to the controller, wherein a number of the indicator lamps is the same as a number of the switch modules, and the controller is configured to control, when a circuit of an i-th switch module is conductive, the indicator lamp corresponding to the i-th switch module to be in a lighted state.

5. The wireless control switch of claim 2, further comprising indicator lamps connected to the controller, wherein a number of the indicator lamps is the same as a number of the switch modules, and the controller is configured to control, when a circuit of an i-th switch module is conductive, the indicator lamp corresponding to the i-th switch module to be in a lighted state.

6. The wireless control switch of claim 3, further comprising indicator lamps connected to the controller, wherein a number of the indicator lamps is the same as a number of the switch modules, and the controller is configured to control, when a circuit of an i-th switch module is conductive, the indicator lamp corresponding to the i-th switch module to be in a lighted state.

7. A wireless control method, performed in a wireless control switch, wherein the wireless control switch comprises a controller having a wireless communication function, at least one switch module arranged between two connection terminals, and an independent power supply for supplying power to the controller, wherein said at least one switch module comprises a relay and a two-way mechanical switch, a control terminal of the relay is connected to a control pin of the controller, and the two-way mechanical switch comprises a first group of changeover switches and a second group of changeover switches, an open or closed state of the first group of changeover switches being synchronized with an open or closed state of the second group of changeover switches;

the first group of changeover switches comprises a first movable terminal, a first fixed terminal and a second fixed terminal, and the relay comprises a relay movable terminal, a first relay fixed terminal and a second relay fixed terminal; wherein the first movable terminal is connected to the relay movable terminal; the first fixed terminal and the first relay fixed terminal are both connected to a first connection terminal of the two connection terminals; and the second fixed terminal and the second relay fixed terminal are both connected to a second connection terminal of the two connection terminals; and the second group of changeover switches comprises a second movable terminal, a third fixed terminal and a fourth fixed terminal; wherein the second movable terminal is connected to a power pin of the independent power supply, the third fixed terminal is connected to a first input pin of the controller, and the fourth fixed terminal is connected to a second input pin of the controller, wherein the method comprises: receiving, by the controller, a turning-on/turning-off instruction; reading, by the controller, the instruction as turning electric equipment on, the electric equipment being connected to the second connection terminal of the two connection terminals; reading, by the controller, a position of the two-way mechanical switch; in responsive to that the second movable terminal is connected to the third fixed terminal, controlling, by the controller, the relay movable terminal of the relay through the control pin, to switch the relay movable terminal to be connected to the second relay fixed terminal, for completing an operation of turning the electric equipment on; and in responsive to that the second movable terminal is connected to the fourth fixed terminal, controlling, by the controller, the relay movable terminal of the relay through the control pin, to switch the relay movable terminal to be connected to the first relay fixed terminal, for completing the operation of turning the electric equipment on.

8. A wireless control method, performed in a wireless control switch, wherein the wireless control switch comprises a controller having a wireless communication function, at least one switch module arranged between two connection terminals, and an independent power supply for supplying power to the controller, wherein said at least one switch module comprises a relay and a two-way mechanical switch, a control terminal of the relay is connected to a control pin of the controller, and the two-way mechanical switch comprises a first group of changeover switches and a second group of changeover switches, an open or closed state of the first group of changeover switches being synchronized with an open or closed state of the second group of changeover switches;

the first group of changeover switches comprises a first movable terminal, a first fixed terminal and a second fixed terminal, and the relay comprises a relay movable terminal, a first relay fixed terminal and a second relay fixed terminal; wherein the first movable terminal is connected to the relay movable terminal; the first fixed terminal and the first relay fixed terminal are both connected to a first connection terminal of the two connection terminals; and the second fixed terminal and the second relay fixed terminal are both connected to a second connection terminal of the two connection terminals; and the second group of changeover switches comprises a second movable terminal, a third fixed terminal and a fourth fixed terminal; wherein the second movable terminal is connected to a power pin of the independent power supply, the third fixed terminal is connected to a first input pin of the controller, and the fourth fixed terminal is connected to a second input pin of the controller, wherein the method comprises:

receiving, by the controller, a turning-on/turning-off instruction;

reading, by the controller, the instruction as turning electric equipment off, the electric equipment being connected to the second connection terminal of the two connection terminals;

reading, by the controller, a position of the two-way mechanical switch;

in responsive to that the second movable terminal is connected to the fourth fixed terminal, controlling, by the controller, the relay movable terminal of the relay through the control pin, to switch the relay movable terminal to be connected to the second relay fixed terminal, for completing an operation of turning the electric equipment off, and in responsive to that the second movable terminal is connected to the third fixed terminal, controlling, by the controller, the relay movable terminal of the relay through the control pin, to switch the relay movable terminal to be connected to the first relay fixed terminal, for completing the operation of turning the electric equipment off.

* * * * *